US009477546B2

(12) United States Patent
Myung

(10) Patent No.: US 9,477,546 B2
(45) Date of Patent: Oct. 25, 2016

(54) METHODS AND APPARATUS FOR OPTIMIZING LIFESPAN OF A STORAGE DEVICE

(71) Applicant: Marvell World Trade Ltd., St. Michael (BB)

(72) Inventor: Yun Chan Myung, Los Gatos, CA (US)

(73) Assignee: Marvell World Trade Ltd., St. Michael (BB)

( * ) Notice: Subject to any disclaimer, the term of this patent is extended or adjusted under 35 U.S.C. 154(b) by 233 days.

(21) Appl. No.: 14/305,383

(22) Filed: Jun. 16, 2014

(65) Prior Publication Data
US 2014/0380122 A1 Dec. 25, 2014

Related U.S. Application Data

(60) Provisional application No. 61/838,008, filed on Jun. 21, 2013.

(51) Int. Cl.
*G11C 29/00* (2006.01)
*G06F 11/10* (2006.01)
*G11C 16/34* (2006.01)

(52) U.S. Cl.
CPC ......... *G06F 11/1008* (2013.01); *G11C 16/349* (2013.01)

(58) Field of Classification Search
CPC ............ G11C 16/3418; G11C 16/349; G11C 16/3495; G11C 2029/0144; G06F 11/073; G06F 11/076; G06F 11/0727
USPC ......................................................... 714/763
See application file for complete search history.

(56) References Cited

U.S. PATENT DOCUMENTS

| 8,943,266 | B2 * | 1/2015 | Koseki ................. G06F 11/108 711/103 |
| 2003/0163633 | A1 * | 8/2003 | Aasheim ............... G06F 3/0616 711/103 |
| 2010/0332923 | A1 | 12/2010 | D'Abreu et al. |
| 2011/0022931 | A1 | 1/2011 | Eleftheriou et al. |
| 2011/0302359 | A1 * | 12/2011 | Schmidberger ..... G06F 12/0246 711/103 |
| 2012/0198128 | A1 * | 8/2012 | Van Aken .......... G06F 12/0246 711/103 |
| 2012/0317459 | A1 | 12/2012 | Yeo et al. |
| 2013/0145079 | A1 * | 6/2013 | Lee ..................... G06F 12/0246 711/103 |

OTHER PUBLICATIONS

International Search Report and Written Opinion for PCT Application No. PCT/US2014/042871 dated Sep. 23, 2014.

* cited by examiner

*Primary Examiner* — David Ton

(57) ABSTRACT

Systems and methods for optimizing lifespan of a storage device are provided. A request to store data to the storage device is received. The storage device includes a plurality of regions. A determination is made that a first group of regions of the plurality of regions is associated with an error measurement threshold that is lower than a second group of regions of the plurality of regions. A region of the storage device that is in the first group of regions is selected based on the determination. The data is stored to the selected region.

23 Claims, 4 Drawing Sheets

METHODS AND APPARATUS FOR OPTIMIZING LIFESPAN OF A STORAGE DEVICE

CROSS REFERENCE TO RELATED APPLICATION

This disclosure claims the benefit of U.S. Provisional Application No. 61/838,008, filed Jun. 21, 2013, which is incorporated herein by reference.

FIELD OF USE

The present disclosure relates generally to solid state storage device systems and methods, and, more particularly, to optimizing lifespan of a solid state storage device.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, is neither expressly nor impliedly admitted as prior art against the present disclosure.

The lifespan of typical solid state storage devices (e.g., NAND flash storage devices) is often determined based on how many program/erase cycles (P/E cycles) are performed on the device. The wear level of these devices tends to increase proportionally with the number of P/E cycles which causes a larger number of read errors. However, the number of P/E cycles each device can perform varies between devices. As such, typical devices that determine the lifespan of a given device based on the number of P/E cycles lead to inaccuracies (e.g., labeling bad devices/blocks prematurely).

SUMMARY

In some embodiments, lifespan of a storage device is optimized. A request to store data to the storage device is received. The storage device includes a plurality of regions. A determination is made that a first group of regions of the plurality of regions is associated with an error measurement threshold that is lower than a second group of regions of the plurality of regions. A region of the storage device that is in the first group of regions is selected based on the determining. The data is stored to the selected region.

In some implementations, each of the plurality of regions is associated with a wear-level. In some implementations, the wear-level associated with the selected region is adjusted in response to storing the data to the selected region. In some embodiments, the wear-level associated with the selected region is reset in response to moving the selected region to a different group. In some embodiments, the wear-level represents at least one of an erase count, program-erase (P/E) cycle, and number of error bits that occur in a read operation.

In some embodiments, the data stored to the selected region is read. An error number representing how many errors result from reading the data from the selected region is computed. In response to determining that the error number is greater than the error measurement threshold associated with the first group of regions, the selected region is moved to the second group of regions from the first group of regions.

In some embodiments, in response to determining that a first decoding technique fails to decode the data stored in the selected portion, a determination is made as to whether a second decoding technique successfully decodes the data stored in the selected portion. The second decoding technique may be more complex than the first decoding technique. In response to determining that the second decoding technique successfully decodes the data, the selected region is moved to the second group of regions from the first group of regions.

In some embodiments, a size associated with the request to store the data is identified. A determination is made as to whether a size of the regions that are in the first group corresponds to at least the identified size. In some implementations, the error measurement threshold represents at least one of a number of read errors and a level of decoding complexity used to decode data read from a given one of the regions.

In some embodiments, a system optimizes lifespan of a storage device. The system includes control circuitry configured to receive a request to store data to the storage device, wherein the storage device comprises a plurality of regions. The control circuitry is configured to determine that a first group of regions of the plurality of regions is associated with an error measurement threshold that is lower than a second group of regions of the plurality of regions. The control circuitry is configured to select a region of the storage device that is in the first group of regions based on the determination. The control circuitry is configured to store the data to the selected region.

In some implementations, each of the plurality of regions is associated with a wear-level. The control circuitry is further configured to adjust the wear-level associated with the selected region in response to storing the data to the selected region. In some implementations, the control circuitry is further configured to reset the wear-level associated with the selected region in response to moving the selected region to a different group. The wear-level may represent at least one of an erase count, program-erase (P/E) cycle, and number of error bits that occur in a read operation.

In some embodiments, the control circuitry is further configured to in response to determining that a first decoding technique fails to decode the data stored in the selected portion, determine whether a second decoding technique successfully decodes the data stored in the selected portion, wherein the second decoding technique is more complex than the first decoding technique. In response to determining that the second decoding technique successfully decodes the data, the control circuitry is further configured to move the selected region to the second group of regions from the first group of regions.

In some embodiments, the control circuitry is further configured to identify a size associated with the request to store the data. The control circuitry is further configured to determine whether a size of the regions that are in the first group corresponds to at least the identified size. In some implementations, the error measurement threshold may represent at least one of a number of read errors and a level of decoding complexity used to decode data read from a given one of the regions.

In some embodiments, a storage device is divided into a plurality of regions. An error characteristic is associated with each of the plurality of regions. Each of the plurality of regions is grouped into a corresponding one of a plurality of groups based on the associated error characteristic of the respective region, wherein each group corresponds to a different error measurement threshold.

BRIEF DESCRIPTION OF THE DRAWINGS

The details of one or more implementations are set forth in the accompanying drawings and the description below. Other features and various advantages will be more apparent upon consideration of the following detailed description, taken in conjunction with the accompanying drawings in which.

DETAILED DESCRIPTION

This disclosure generally relates to optimizing the lifespan of a storage device. For illustrative purposes, this disclosure is described in the context of a solid state storage device (e.g., a flash storage device or a NAND-based storage device). It should be understood, however, that this disclosure is applicable to any other type of non-volatile storage device (e.g., magnetic storage device, ROM, PROM, EPROM, EEPROM, nvSRAM, FeRAM, MRAM, PRAM, CBRAM, SONOS, RRAM, NRAM, Millipede memory, or holographic storage device).

Figure 1:
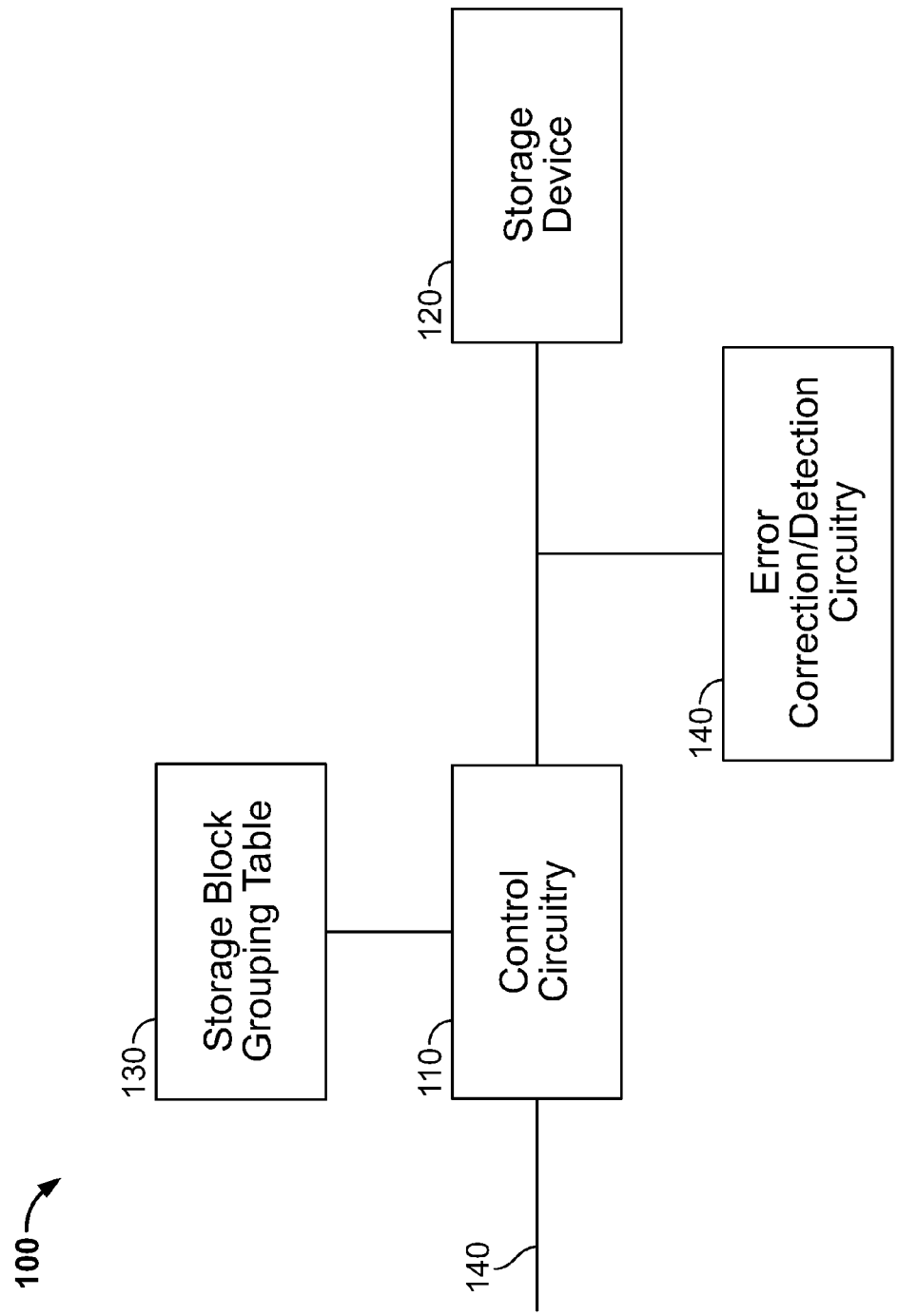
FIG. 1 is a diagram of an illustrative storage device system in accordance with an embodiment of the present disclosure.

FIG. 1 is a diagram of an illustrative storage device system 100 in accordance with an embodiment of the present disclosure. System 100 includes control circuitry 110, a solid state storage device 120, a storage block grouping table 130, and error correction/detection circuitry 140.

In some embodiments, control circuitry 110 may receive data 140 from another system component (not shown). For example, data 140 may be provided by an application or another storage device (e.g., DRAM). Data 140 may include a user data portion, an address portion and a control portion indicating a read or write request (e.g., indicating whether to read or write the user data portion to the address portion).

Storage block grouping table 130 may include a mapping of blocks of storage device 120 and group numbers. For example, storage device 120 may include a plurality of portions or regions (e.g., blocks). Each portion or region may be configured to store a predetermined number of bits of information. In some implementations, each portion or region may include an information portion. The information portion may store or track a number of P/E cycles performed on the given portion or region and/or the number of read errors that occurred in the portion or region. Initially, all of the portions or regions may be associated with a first group number (e.g., Group 0) which may be the lowest level group. In some embodiments, control circuitry 110 may associate all portions or regions of storage device 120 with the first group number when system 100 is reset or receives a reset signal. To associate all the portions or regions of storage device 120 with the first group number, control circuitry 110 may store in table 130 identifiers of all the portions or regions in storage device 120 in a row corresponding to the first level group. In some embodiments, all portions or regions of storage device 120 may be associated with the first group number just once after storage device 120 is produced in a factory. Subsequent associations between portions or regions of storage device 120 with different group numbers may not change when the system is reset or receives a reset signal.

In some embodiments, table 130 may be divided into a plurality of groups. Each group may be associated with a different level and a different error measurement threshold. In some implementations, the error measurement threshold may represent a number of read errors that result from reading data from a given portion or region. In some implementations, the error measurement threshold may represent a level of decoding complexity used to decode data read from a given portion or region (e.g., one level may be an LDPC decoding technique that uses hard information and another level with greater complexity may be an LDPC decoding technique that uses soft information). For example, table 130 may include four groups. A first group, at the lowest level, may be associated with a first error measurement threshold (e.g., a first maximum number of read errors). A second group, at a level higher than the first group, may be associated with a second error measurement threshold (e.g., a second maximum number of read errors). The second error measurement threshold may be greater than the first error measurement threshold. A third group, at a level higher than the second group, may be associated with a third error measurement threshold (e.g., a third maximum number of read errors). The third error measurement threshold may be greater than the first and second error measurement thresholds. Namely, the second error measurement threshold may be a value that is between a value of the first and a value of the third error measurement thresholds. A fourth group, at the highest level than the other groups, may not be associated with an error measurement threshold, but may represent portions or regions for which an uncorrectable number of errors occurred during read operations. In some implementations, portions or regions associated with lower levels may be associated with a longer lifespan than blocks associated with higher levels. As such, when storing information to storage device 120, control circuitry 110 may select portions or regions at the lowest level first to maximize the lifespan of storage device 120.

When a read operation is performed on a portion or region that results in a number of errors that is not correctable, the block is labeled a "bad block." As referred to herein, the phrase "bad block" should be understood to mean a portion or region having uncorrectable errors and/or other fatal errors. Control circuitry 110 may avoid writing data to portions or regions labeled bad blocks when receiving a write request. In some implementations, when the number of bad blocks of device 120 reaches a given threshold, device 120 is determined to be a bad device and no longer useable.

In some embodiments, to optimize a lifespan of storage device 120, control circuitry 110 may search for blocks of storage device 120 having the lowest or smallest P/E cycles when writing data to storage device 120. For example, in response to receiving a request to store data to storage device 120, control circuitry 110 may identify portions or regions of storage device 120 having the lowest P/E cycles as target portions or regions. Control circuitry 110 may store the received data to these target portions or regions.

In some embodiments, control circuitry 110 may select portions or regions of storage device 120 to which to write data based on a group number associated with the portion or region. For example, control circuitry 110 may first search for portions or regions associated with a lowest level in table 130 as target portions or regions to which to write data. In response to determining that the number of portions or regions available to write data to (e.g., free blocks) at the lowest is sufficient to store the size of the received data, control circuitry 110 may store the data to the portions or regions in the lowest level (e.g., Group 0). In response to determining that the number of portions or regions available to write data to (e.g., free blocks) at the lowest is insufficient to store the size of the received data, control circuitry 110 may then search for free blocks at the next level (e.g., Group 1) for storing a remaining portion of the data that could not be stored in first level portions or regions.

In some embodiments, when storing data to portions or regions of storage device 120, control circuitry 110 may store data to those free blocks at that level that have the lowest P/E cycle count among the other free blocks in the same level. For example, control circuitry 110 may determine that the first group includes ten free portions or regions, but only three are needed to store the received data. Control circuitry 110 may retrieve the portion or region information from each of the free portions or regions to determine the P/E cycle count of each portion or region in the first group. Control circuitry 110 may select three of the ten portions or regions having the lowest P/E cycle count between the ten portions or regions. Control circuitry 110 may store the data to the selected three portions or regions and may update the P/E cycle count information associated with those portions or regions. As such, data will be stored to the least used or the portions or regions having the largest relative lifespan among other portions or regions in the same group.

In some embodiments, control circuitry 110 may move portions or regions from being associated with one level to being associated with a higher level based on an error measurement (e.g., number of read errors). For example, control circuitry 110 may receive a request to read information from a given portion or region. Control circuitry 110 may retrieve the information from the given portion or region and perform error correction/detection on the retrieved information using error correction/detection circuitry 140. Error correction/detection circuitry 140 may transmit decoded read data to control circuitry 110 for transmission to the requesting device.

Error correction/detection circuitry 140 may include any types or combination of different error correction/detection circuitries. For example, error correction/detection circuitry 140 may include a single- or multi-stage low density parity check (LDPC) decoder. The LDPC decoder may decode or perform error correction in multiple stages. The received data may be decoded using decoding techniques having increasing levels of complexity. Specifically, if a first decoding technique fails to decode the read data, a more complex decoding technique may be employed to attempt to correct the read data. For example, a first LDPC stage may decode the data using hard information. If the first LDPC stage fails to correct errors, a second LDPC stage may be employed which decodes the data using 2-bit or n-bit information. If the second LDPC stage fails to correct errors, a third LDPC stage may be employed which decodes the data using soft information.

In some implementations, error correction/detection circuitry 140 may transmit a signal indicating an error measurement value associated with reading the data from the portion or region. For example, error correction/detection circuitry 140 may transmit a signal indicating a number of errors that were detected/corrected in the read data. Alternatively, or in addition, error correction/detection circuitry 140 may transmit a signal indicating the number of decoding levels or the decoding complexity that was employed to decode or correct errors in the read data. Based on the number of errors and/or based on the decoding complexity employed to decode the read data, control circuitry 110 may instruct table 130 to move the given portion or region from being associated with a given level to the next higher level. For example, control circuitry 110 may instruct table 130 to move the given portion or region from being associated with a second level to being associated with a third level.

In some embodiments, in response to receiving the request to read data from a given portion or region, control circuitry 110 may cross-reference table 130 to determine which group the portion or region is associated with. Control circuitry 110 may retrieve an error measurement threshold associated with the group of the portion or region. In some implementations, control circuitry 110 may compare information contained in the error measurement value received from error correction/detection circuitry 140 with the error measurement threshold associated with the portion or region. In response to determining that the error measurement value does not exceed the error measurement threshold, control circuitry 110 may not change the group associated with the portion or region in table 130. In response to determining that the error measurement value exceeds the error measurement threshold, control circuitry 110 may increase the group level of the portion or region. Specifically, control circuitry 110 may associate the portion or region with the next level group (e.g., from group 1 to group 2) in table 130 in response to determining that the error measurement value exceeds the error measurement threshold. In addition, in response to determining that the error measurement value exceeds the error measurement threshold and moving the portion or region to be associated with a higher level group, control circuitry 110 may reset or clear the P/E cycle count included in the portion or region information for the given portion or region. By resetting or clearing the P/E cycle count of the portion or region, control circuitry 110 ensures that the portion or region last added to the group of portions or regions is also going to be selected to be written to after other portions or regions in the same group are selected to be written to. Namely, the lifespan of a given portion or region in a particular group is determined based on how recently the portion or region was added to the group.

For example, error measurement value received from error correction/detection circuitry 140 may indicate a number of read errors that occurred as a result of retrieving data from a given portion or region of storage device 120. Control circuitry 110 may compare the number of read errors with the error measurement threshold associated with the portion or region. In response to determining that the number of read errors does not exceed the error measurement threshold, control circuitry 110 may not change the group associated with the portion or region in table 130. In response to determining that the number of read errors exceeds the error measurement threshold, control circuitry 110 may increase the group level of the portion or region. Specifically, control circuitry 110 may associate the portion or region with the next level group (e.g., from group 1 to group 2) in table 130 in response to determining that the number of read errors exceeds the error measurement threshold. In addition, in response to determining that the number of read errors exceeds the error measurement threshold and moving the portion or region to be associated with a higher level group, control circuitry 110 may reset or clear the P/E cycle count included in the portion or region information for the given portion or region. In some implementations, the P/E cycle count may not be reset or cleared in response to determining that the number of read errors exceeds the error measurement threshold.

In some embodiments, two or more P/E cycle counts may be maintained for each portion or region of storage device 120. A first P/E cycle count may represent the total P/E cycles that have been accumulated since storage device 120 was manufactured. The first P/E cycle count may not be cleared when a portion or region is associated with a next level (e.g., when the portion or region is promoted from group 1 to group 2). A second P/E cycle count may represent the total number of P/E cycles that have accumulated since the corresponding portion or region was associated with a next level (e.g., since the portion or region is promoted from group 1 to group 2). In particular, the first P/E cycle count may represent the lifetime P/E cycle count of a given portion or region, while the second P/E cycle count may represent the P/E cycles accumulated during the time the given portion or region has been associated with a given level. As referred to herein, the term "P/E cycle count" is used interchangeably with the term "erase count" and should be understood to have the same meaning.

For example, error measurement value received from error correction/detection circuitry 140 may indicate a level of complexity used to decode the read data from a given portion or region of storage device 120. Control circuitry 110 may compare the level of complexity used to decode the read data with the error measurement threshold associated with the portion or region. In response to determining that the level of complexity used to decode the read data does not exceed the error measurement threshold, control circuitry 110 may not change the group associated with the portion or region in table 130. In response to determining that the level of complexity used to decode the read data exceeds the error measurement threshold, control circuitry 110 may increase the group level of the portion or region. Specifically, control circuitry 110 may associate the portion or region with the next level group (e.g., from group 1 to group 2) in table 130 in response to determining that the level of complexity used to decode the read data exceeds the error measurement threshold. In addition, in response to determining that the level of complexity used to decode the read data exceeds the error measurement threshold and moving the portion or region to be associated with a higher level group, control circuitry 110 may reset or clear the P/E cycle count included in the portion or region information for the given portion or region.

Figure 2:
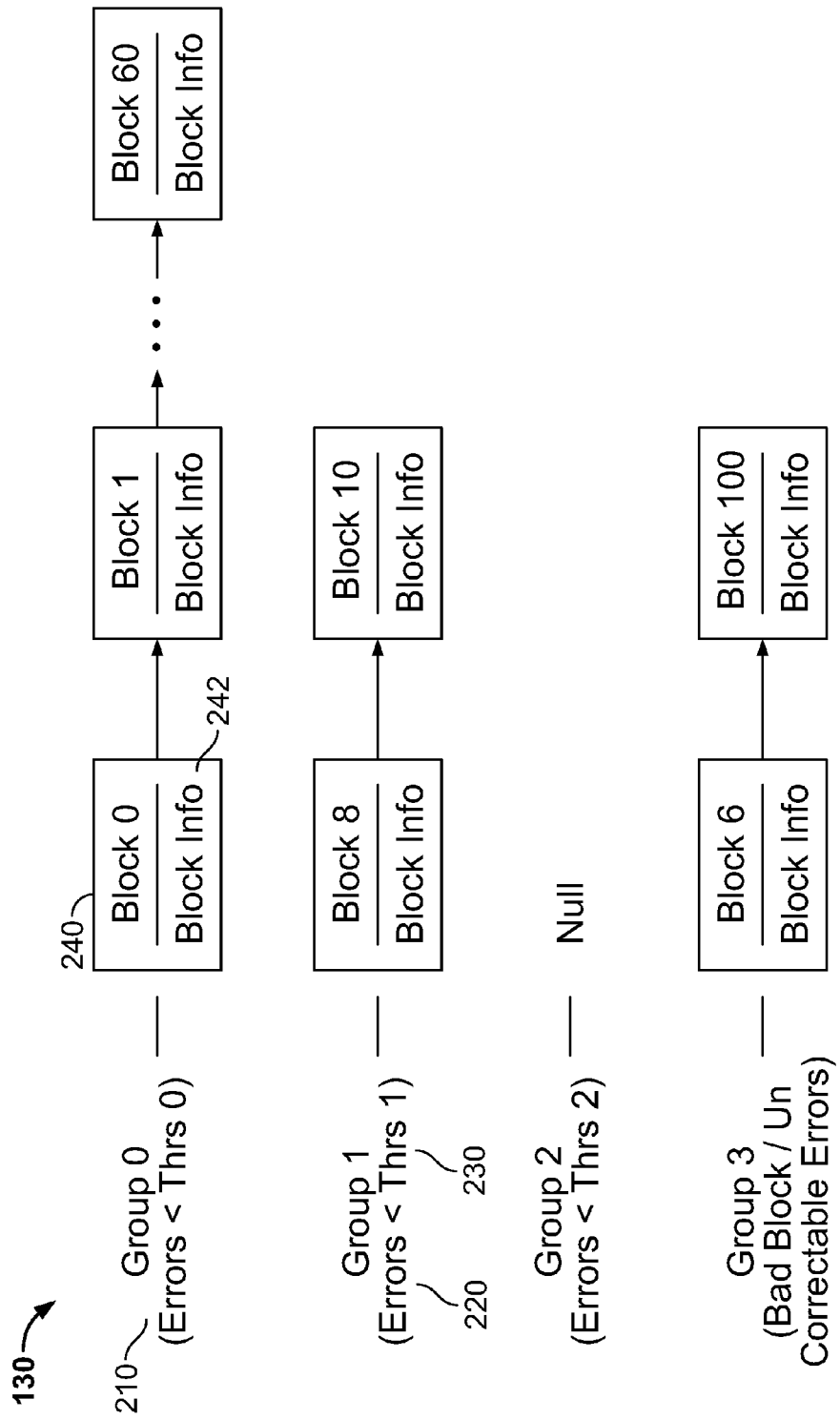
FIG. 2 is a diagram of an illustrative storage block grouping table in accordance with an embodiment of the present disclosure.

FIG. 2 is a diagram of an illustrative storage block grouping table 130 in accordance with an embodiment of the present disclosure. As discussed above, table 130 may include a plurality of groups 210. Each group 210 may represent portions or regions of storage device 120 for which an error measurement value 220 is less than, or equal to, an error measurement threshold 230. Group 0 may be associated with a first error measurement threshold 230 that is less, or smaller than, a second error measurement threshold 230 associated with Group 1. Similarly, the second error measurement threshold associated with Group 1 may be less, or smaller than, a third error measurement threshold 230 associated with Group 2. The Group in table 130 (e.g., Group 3) with the highest level may represent bad blocks.

For example, first group 210 may include, or be associated with, multiple regions 240 of storage device 120. Each region 240 may be identical in size or may differ in size. Each region 240 may include an information segment 242. Information segment 242 may specify a number of P/E cycles performed on the given portion or region 240 and/or the number of read errors that occurred in the portion or region 240. Control circuitry 110 may update information segment 242 each time data is written to and/or read from the corresponding region 240. In some implementations, control circuitry 110 may clear the information stored in information segment 242 when the corresponding region 240 is moved to or associated with another group (e.g., Group 2). For example, control circuitry 110 may reset or clear the P/E cycle count specified in information segment 242 for the given portion or region 240 after control circuitry 110 instructs table 130 to move region 240 to another group.

The portions or regions of storage device 120 may be organized in table 130 as a linked list corresponding to a respective group. The linked list may be sorted in ascending or descending order according to the P/E cycle count of each respective portion or region in the group. Based on the sorting, control circuitry 110 selects portions or regions in a group as targets to write data starting with the head of the linked list when the list is sorted in ascending order of P/E cycle count. In response to determining a need to move a portion or region from one group to another, control circuitry 110 may remove the portion or region from one linked list and add the portion or region to the tail of the linked list of the next adjacent group. For example, control circuitry 110 may remove the portion or region from the linked list of Group 1 and add the portion or region to the tail of the linked list of Group 2. Other methods and data structures for organizing and tracking which portions or regions of storage device 120 are associated with which levels may be employed, such as a table or an array.

Figure 3:
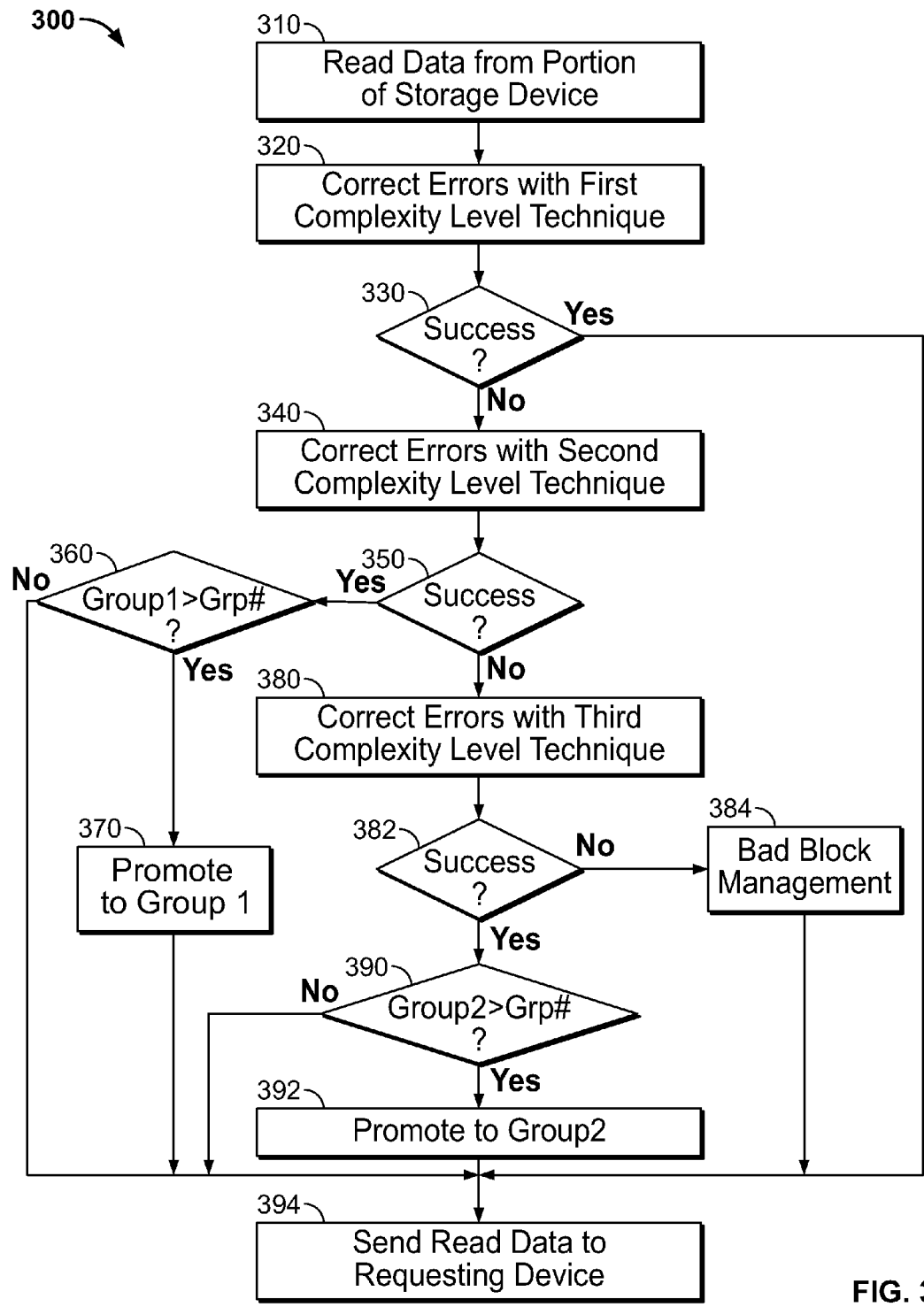
FIGS. 3 and 4 are illustrate processes for optimizing the lifespan of a storage device in accordance with an embodiment of the present disclosure.

FIG. 3 is an illustrate process 300 for optimizing the lifespan of a storage device in accordance with an embodiment of the present disclosure. At 310, data is read from a portion of a storage device. For example, control circuitry 110 may receive a request to read data from a particular block of storage device 120.

At 320, errors are corrected using a first complexity level technique. For example, error correction/detection circuitry 140 may receive the read data from the block and attempt to correct errors in the block using LDPC with hard information.

At 330, a determination is made as to whether the errors were successfully corrected. In response to determining that the errors were successfully corrected, the process proceeds to 394, otherwise the process proceeds to 340. For example, error correction/detection circuitry 140 may transmit a signal to control circuitry 110 indicating whether the data was successfully read and decoded, a decoding level or type used to decode the data, and/or a number of errors that resulted from reading the data.

At 340, errors are corrected using a second complexity level technique. The second complexity level may be more complex than the first complexity level technique. For example, error correction/detection circuitry 140 may receive the read data from the block and attempt to correct errors in the block using LDPC with 2-bit information.

At 350, a determination is made as to whether the errors were successfully corrected. In response to determining that the errors were successfully corrected, the process proceeds to 360, otherwise the process proceeds to 380. For example, error correction/detection circuitry 140 may transmit a signal to control circuitry 110 indicating whether the data was successfully read and decoded, a decoding level or type used to decode the data, and/or a number of errors that resulted from reading the data.

At 360, a determination is made as to whether a group number associated with the portion from which the data was read is less than a group associated with the second complexity level decoding technique (e.g., Group 1). In response to determining that the group number associated with the portion is less than Group 1, the process proceeds to 370, otherwise the process proceeds to 394. For example, control circuitry 110 may cross-reference table 130 to determine which list the block is in from where data was read. Table 130 may identify the group number associated with the block and return the information to control circuitry 110. Control circuitry 110 may also cross-reference table 130 to identify the error measurement threshold associated with the group number associated with the block to determine whether the error measurement (e.g., type of decoding used to correct the data) exceeds the error measurement threshold of the associated group. When the error measurement exceeds the error measurement threshold of the group, control circuitry 110 may proceed to 370.

At 370, the portion from where data was read is promoted or moved to Group 1 (e.g., the group associated with the second complexity level decoding technique). For example, control circuitry 110 may instruct table 130 to unlink the block from the current group and link the block with the list associated with the next adjacent group of blocks. Control circuitry 110 may also reset or clear the P/E cycle count of the block.

At 380, errors are corrected using a third complexity level technique. The third complexity level may be more complex than the first and second complexity level techniques. For example, error correction/detection circuitry 140 may receive the read data from the block and attempt to correct errors in the block using LDPC with soft information.

At 382, a determination is made as to whether the errors were successfully corrected. In response to determining that the errors were successfully corrected, the process proceeds to 390, otherwise the process proceeds to 384. For example, error correction/detection circuitry 140 may transmit a signal to control circuitry 110 indicating whether the data was successfully read and decoded, a decoding level or type used to decode the data, and/or a number of errors that resulted from reading the data.

At 384, bad block management is initiated. For example, control circuitry 110 may instruct table 130 to move the block to the highest group that represents bad blocks. This prevents writing or reading from the block in the future.

At 390, a determination is made as to whether a group number associated with the portion from which the data was read is less than a group associated with the third complexity level decoding technique (e.g., Group 2). In response to determining that the group number associated with the portion is less than Group 2, the process proceeds to 392, otherwise the process proceeds to 394. For example, control circuitry 110 may cross-reference table 130 to determine which list the block is in from where data was read. Table 130 may identify the group number associated with the block and return the information to control circuitry 110. Control circuitry 110 may also cross-reference table 130 to identify the error measurement threshold associated with the group number associated with the block to determine whether the error measurement (e.g., type of decoding used to correct the data) exceeds the error measurement threshold of the associated group. When the error measurement exceeds the error measurement threshold of the group, control circuitry 110 may proceed to 392.

At 392, the portion from where data was read is promoted or moved to Group 2 (e.g., the group associated with the third complexity level decoding technique). For example, control circuitry 110 may instruct table 130 to unlink the block from the current group and link the block with the list associated with the next adjacent group of blocks. Control circuitry 110 may also reset or clear the P/E cycle count of the block.

At 394, the read data is sent to the requesting device. For example, control circuitry 110 may return the information stored in a given block of storage device 120 to another system component that requested that information (e.g., a central processing unit (CPU)).

Figure 4:
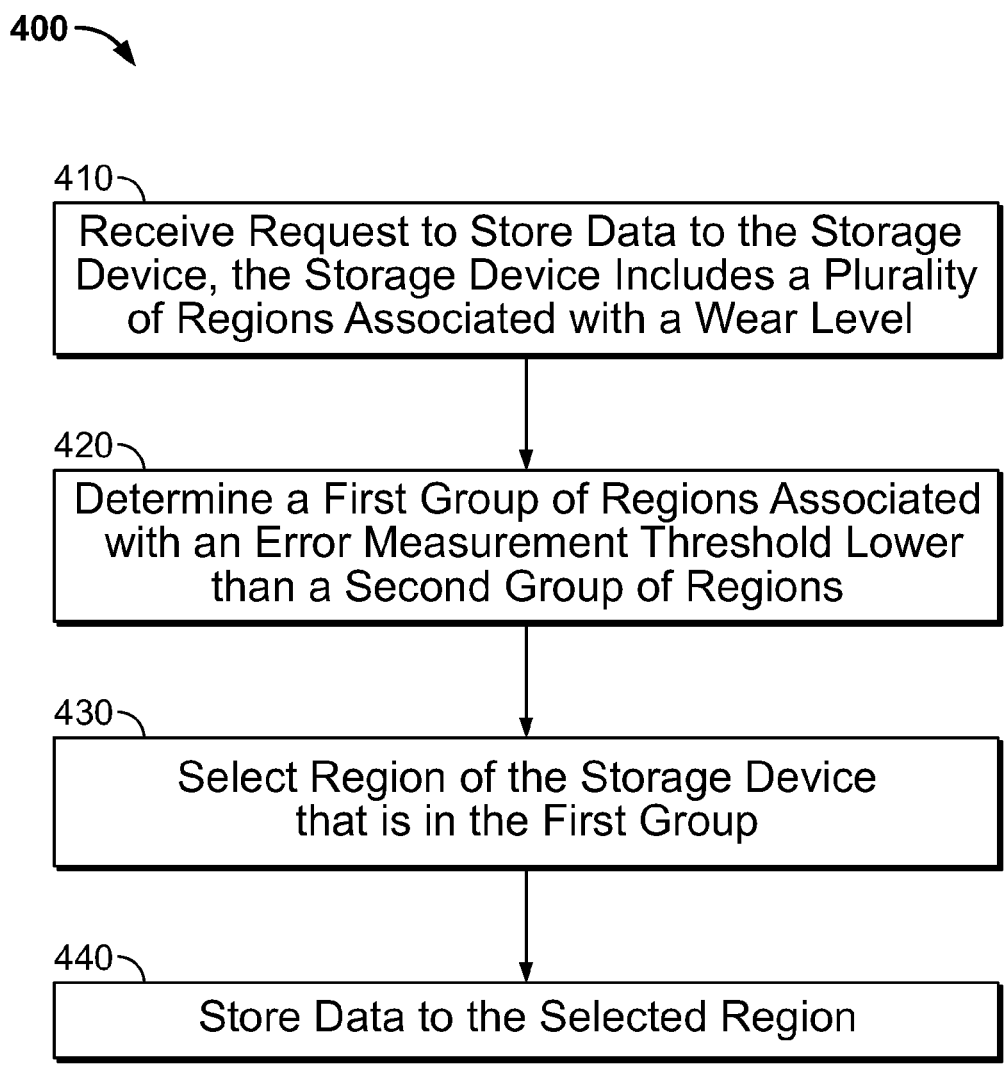

FIG. 4 is an illustrate process 400 for optimizing the lifespan of a storage device in accordance with an embodiment of the present disclosure. At 410, a request to store data to the storage device is received, where the storage device includes a plurality of regions, each of the plurality of regions is associated with a wear-level. For example, control circuitry 110 may receive a request to store data to a particular block of storage device 120. The particular block may include information indicating the P/E cycle count of the block and the block may be associated with a group representing blocks having less than a threshold error measurement value.

At 420, a determination is made as to a first group of regions of the plurality of regions that is associated with an error measurement threshold that is lower than a second group of regions of the plurality of regions. For example, control circuitry 110 may identify which groups within table 130 has portions or regions and is associated with the lowest error measurement threshold of the groups having portions or regions free.

At 430, a region of the storage device is selected that is in the first group of regions. For example, control circuitry 110 may retrieve from table 130 one or more blocks having the lowest P/E cycle count among a remaining set of blocks in the group (e.g., the one or more blocks that are first in the linked list of blocks of the group).

At 440, data is stored to the selected region.

The foregoing describes methods and an apparatus for storing information in a solid state storage device based on data classification. The above-described embodiments of the present disclosure are presented for the purposes of illustration and not of limitation. Furthermore, the present disclosure is not limited to a particular implementation. For example, one or more steps of methods described above may be performed in a different order (or concurrently) and still achieve desirable results. In addition, the disclosure may be implemented in hardware, such as on an application-specific integrated circuit (ASIC) or on a field-programmable gate array (FPGA). The disclosure may also be implemented in software.

What is claimed is:

1. A method for optimizing lifespan of a storage device, the method comprising:
   receiving a request to store data to the storage device, wherein the storage device comprises a plurality of regions;
   determining that a first group of regions of the plurality of regions is associated with a first error measurement threshold that is lower than a second error measurement threshold associated with a second group of regions of the plurality of regions;
   checking for availability of a first available region from the first group of regions based on the determining;
   storing a portion of the data to the first available region when the checking reveals availability; and storing the portion of the data to a second available region from the second group of regions when the checking reveals that no available region for the first group exists.

2. The method of claim 1, wherein each of the plurality of regions is associated with a wear-level further comprising adjusting the wear-level associated with the first available region in response to storing the portion of data to the first available region.

3. The method of claim 2 further comprising:
reading the data stored to the first available region;
computing an error number representing how many errors result from reading the data from the first available region; and
in response to determining that the error number is greater than the error measurement threshold associated with the first group of regions, moving the first available region to the second group of regions from the first group of regions.

4. The method of claim 2 further comprising resetting the wear-level associated with the region in response to moving the first available region to a different group.

5. The method of claim 2, wherein the wear-level represents at least one of an erase count, program-erase(P/E) cycle, and number of error bits that occur in a read operation.

6. The method of claim 1 further comprising:
in response to determining that a first decoding technique fails to decode the data stored in the first available region, determining whether a second decoding technique successfully decodes the data stored in the first available region, wherein the second decoding technique is more complex than the first decoding technique; and
in response to determining that the second decoding technique successfully decodes the data, moving the first available region to the second group of regions from the first group of regions.

7. The method of claim 6, wherein the first decoding technique and the second decoding technique includes Low-Density Parity-Check (LDPC) error correction.

8. The method of claim 1 further comprising:
identifying a size associated with the request to store the data; and
determining whether a size of the regions that are in the first group corresponds to at least the identified size.

9. The method of claim 8 further comprising:
in response to determining that the size of the regions in the first group is less than the identified size, selecting, as the first available region, a region of the storage device that is in the second group of regions instead of the first group of regions.

10. The method of claim 1, wherein the error measurement threshold represents at least one of a number of read errors and a level of decoding complexity used to decode data read from a given one of the regions.

11. The method of claim 1, further comprising:
storing the portion of the data to a second available region when the portion of the data is stored to the first available region and the first available region has a storage volume less than a total volume of the data.

12. A system for optimizing lifespan of a storage device, the system comprising:
control circuitry configured to:
receive a request to store data to the storage device, wherein the storage device comprises a plurality of regions;
determine that a first group of regions of the plurality of regions is associated with a first error measurement threshold that is lower than a second error measurement threshold associated with a second group of regions of the plurality of regions;
check for availability of a first available region from the first group of regions based on the determining;
store a portion of the data to the first available region when the checking reveals availability; and
store the portion of the data to the second available region from the second group of regions when the checking reveals that no available region from the first group exists.

13. The system of claim 12, wherein each of the plurality of regions is associated with a wear-level, and wherein the control circuitry is further configured to adjust the wear-level associated with the first available region in response to storing the data to the first available region.

14. The system of claim 13, wherein the control circuitry is further configured to:
read the data stored to the first available region;
compute an error number representing how many errors result from reading the data from the first available region; and
in response to determining that the error number is greater than the error measurement threshold associated with the first group of regions, move the first available region to the second group of regions from the first group of regions.

15. The system of claim 13, wherein the control circuitry is further configured to reset the wear-level associated with the first available region in response to moving the first available region to a different group.

16. The system of claim 13, wherein the wear-level represents at least one of an erase count, program-erase (P/E) cycle, and number of error bits that occur in a read operation.

17. The system of claim 12, wherein the control circuitry is further configured to:
in response to determining that a first decoding technique fails to decode the data stored in the first available region, determine whether a second decoding technique successfully decodes the data stored in the first available region, wherein the second decoding technique is more complex than the first decoding technique; and
in response to determining that the second decoding technique successfully decodes the data, move the region to the second group of regions from the first group of regions.

18. The system of claim 17, wherein the first decoding technique and the second decoding technique includes Low-Density Parity-Check (LDPC) error correction.

19. The system of claim 12, wherein the control circuitry is further configured to:
identify a size associated with the request to store the data; and
determine whether a size of the regions that are in the first group corresponds to at least the identified size.

20. The system of claim 19, wherein the control circuitry is further configured to:
in response to determining that the size of the regions in the first group is less than the identified size, select, as the first available region, a region of the storage device that is in the second group of regions instead of the first group of regions.

21. The system of claim 12, wherein the error measurement threshold represents at least one of a number of read errors and a level of decoding complexity used to decode data read from a given one of the regions.

22. The method of claim 12, wherein the control circuitry is further configured to:
store a remaining portion of the data to the second available region when the portion of the data is stored to the first available region and the first available region has a storage volume less than a total volume of the data.

23. A method for managing lifespan of a storage device, the method comprising:
dividing the storage device into a plurality of regions;
associating an error characteristic with each of the plurality of regions;
grouping each of the plurality of regions into a corresponding one of a plurality of groups based on the associated error characteristic of the respective region, wherein each group corresponds to a different error measurement threshold; and
checking for availability of a first available region associated with a first error measurement threshold;
storing a portion of the data to the first available region when the checking reveals availability; and
storing a portion of the data to the second available region associated with a second error measurement threshold higher than the first error measurement threshold when the checking reveals that no available region associated with the first error measurement threshold exists.

* * * * *